United States Patent [19]

Byers

[11] 4,141,732
[45] Feb. 27, 1979

[54] COLOR SEPARATED FONT

[76] Inventor: Thomas L. Byers, 3004 SE. 21, Oklahoma City, Okla. 73115

[21] Appl. No.: 820,077

[22] Filed: Jul. 28, 1977

Related U.S. Application Data

[63] Continuation-in-part of Ser. No. 780,631, Mar. 23, 1977.

[51] Int. Cl.² .......................... G03C 5/04; G03B 15/00
[52] U.S. Cl. ............................................ 96/41; 96/42; 96/43; 354/292
[58] Field of Search ...................................... 96/41–43, 96/78, 87; 354/292

[56] References Cited

U.S. PATENT DOCUMENTS

| | | | |
|---|---|---|---|
| 2,105,555 | 1/1938 | Ish-Shalom et al. | 354/292 |
| 3,099,089 | 7/1963 | Bond et al. | 96/43 |
| 3,902,901 | 9/1975 | Vogel | 96/42 X |

*Primary Examiner*—Edward C. Kimlin
*Assistant Examiner*—Alfonso T. Suro Pico
*Attorney, Agent, or Firm*—Robert K. Rhea

[57] ABSTRACT

A method of preparing color separated font characters and components in which positive proofs of the characters of the font intended for color printing are arranged by rows in linear spaced relation with the color components of each character of the font disposed one above the other on a flat plane in predetermined spaced relation. The color separated components and characters of the font are then printed on a transparent film for subsequent transfer of selected characters of the font to a layout sheet for photographic reproduction and forming plates or engravings to be printed in two or more colors.

4 Claims, 2 Drawing Figures

COLOR SEPARATED FONT

CROSS REFERENCE TO RELATED APPLICATION

This application is a continuation-in-part of an application filed by me in the U.S. Patent and Trademark Office on Mar. 23, 1977, Ser. No. 780,631 for Color Separated Film Strip Type Font.

BACKGROUND OF THE INVENTION

1. Field of the invention.

The present invention relates to graphic design and more particularly to a method of preparing color separated fonts for transfer to a commercial art layout containing font characters to be printed in color.

In preparing camera ready advertising layouts, or the like, containing characters of a font to be printed in color it has been the practice to prepare overlays for the supplemental components of each font character, to be printed in color, by hand cutting a peel-away section of film to leave only that portion of the film on the transparent backing sheet for photoengraving and printing the colors of the respective characters. Obviously, this is a time consuming task requiring considerable skill on the part of the artist in making the color separation overlay so that one or more color plates will register with the respective characters.

2. Description of the prior art.

It is well known in graphic carts to use commercial dry transfer sheets containing characters of the alphabet to form cuts or headings on artwork ready for photoengraving or photography. One advantage of the dry transfer sheets is that the spacing between the characters, both linear and vertically with resepct to a reference line, may be adjusted by the artist to achieve balance or a desired effect, however, as mentioned above, if the characters are to be printed in color, it has heretofor been necessary, to obtain color registration, to manually cut or form overlay sheets of the supplemental component of each character to be printed in color. Since this procedure is a time consuming and tedious task, the characters to be printed in one or more colors is generally limited to titles, headings, or the like. One example of forming registerable color separations of the characters of type font is disclosed by U.S. Pat. No. 2,105,555 which utilizes the matrix of a keyboard-operated type setting machine, or the like, in which the respective matrix contains the outline of the respective character and a color component so that a selected series of the matrix forms a word or words to be photographically reproduced for subsequent printing in color in a conventional manner. The principal disadvantage of the use of such matrix for color separation is that the spacing between the characters forming a word can not be adjusted to decrease the spacing between any two characters, to achieve a desired balance, less than the physical thickness of the matrix portions between two or more characters on juxtaposed matrixes.

It is also known to form a negative film strip of the characters of a font, the characters being arranged linearly on an elongated strip of film or on an endless circular strip of film, such as disclosed by U.S. Pat. No. 3,821,770. The linear or circular strip of film may be used by either manually or by a photocomposing machine in successively exposing selected characters of the font on photographic paper to obtain the desired message and subsequent photoengraving. Such film strips increase the versatility of composing camera ready artwork, however, if the characters printed from the film strip are to be reproduced partially in color it becomes necessary to manually cut overlay strips containing the color separated components of the respective character.

This invention overcomes the above disadvantage by printing a font in linear form on a transparent sheet with each character of the font including a color separated component arranged in predetermined superposed relation in the plane of the transparent sheet for subsequent transfer of each selected character and its color component as a unit to a working drawing to be photographically reproduced and subsequently printed in more than one color.

This invention is distinctive over my above named copending application by eliminating the requirement of forming negative film strips and the use of a film strip printing apparatus.

SUMMARY OF THE INVENTION

A selected font, for example, a font containing outline characters, is modified in any desired manner to form one or more components of each character to be printed in a color different than the color of the respective outline characters. The outlined character of the font and its color separated component are arranged in linear relation with the respective component of each character disposed in superposed spaced relation in a common plane and printed on a transparent sheet or film in combination with a series of register marks similarly arranged in predetermined spaced relation. Selected characters and its respective color components on the transparent sheet are then transferred to a graphic design to form a meassage to be printed in color with each group or line of characters forming a message having at least one register mark at the respective ends thereof. The font characters and color separated components are then reproduced photographically and by printing in a conventional manner.

The principal object of this invention is to provide a transparent film containing a plurality of font characters, each having at least one color separated component arranged in predetermined spaced relation for transfer of selected characters and components as individual units to a working drawing to provide camera ready artwork for subsequent printing in more than one color.

DESCRIPTION OF THE PREFERRED EMODIMENT

Figure 1:
FIG. 1 is a top plan view of a section of transparent film overlying a backing sheet and containing font characters and color separated components thereof arranged in predetermined spaced relation; and, FIG. 2 illustrates selected characters of the font, and color components, when transferred to a graphic design to form a message for photographic reproduction and subsequent printing.
Figure 2:
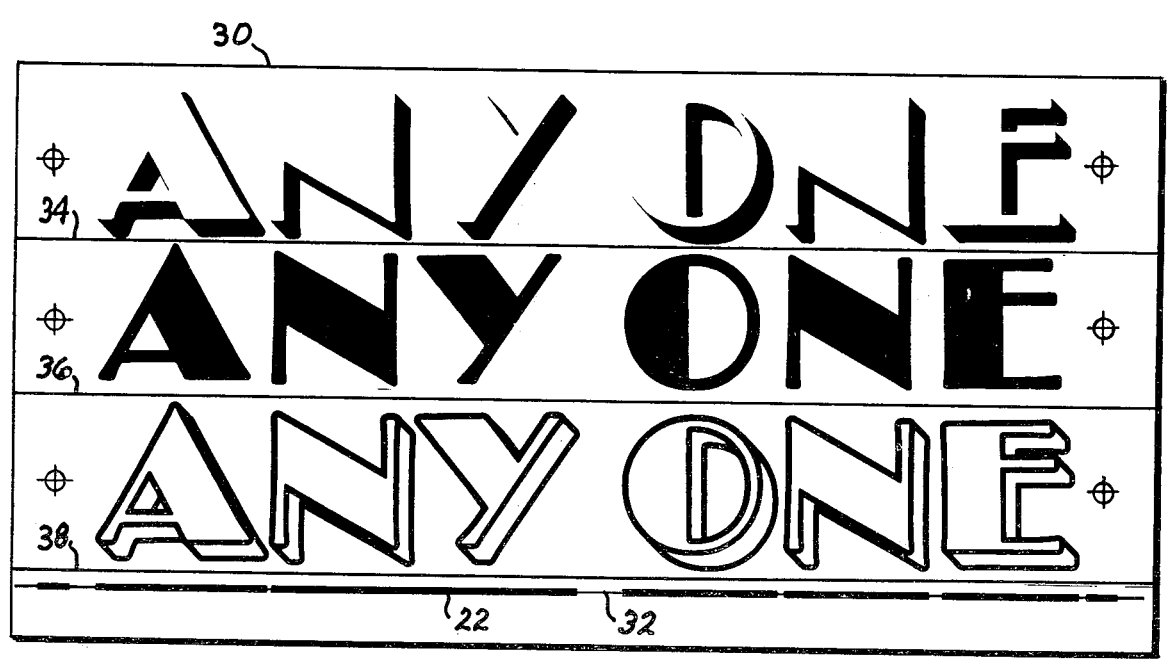

Like characters of reference designate like parts in those figures of the drawings in which they occur.

In the drawings:

In carrying out the invention, a font is selected, preferably using both upper and lower case characters, which are modified, as by cutting color separation overlays and/or by using a known graphic modifier of font, for example, my U.S. Pat. No. 3,927,942.

The reference numeral 10 indicates outline characters of a font which has been modified to form a shadow area for each character. Positive proofs of the font characters 10 are arranged in linear alphabetical relation and including a series of each character with the number of characters in each series being predetermined.

The numerals 12 and 14 respectively indicate a like series of background and shadow areas of the respective character of the font 10 similarly arranged in linear rows and respectively spaced above the font characters a predetermined distance. The characters 10 and respective color separated components 12 and 14, arranged as described above, are printed on a transparent sheet of film 16 normally overlying a protective base or backing sheet 18. The film 16 may be provided with an adhesive coating for adherence to a graphic design or, preferably, the font characters and color components are printed on the underside of the film for dry transfer to a graphic design by a buffing action on the top surface of the film in a well known manner. A series of register marks 20 are similarly arranged in predetermined spaced relation and printed on the film 16 for the purposes presently explained.

The film 16 preferably contains a series of similarly printed transfer lines 22 arranged below the respective characters of the font 10 and the register marks for the purposes presently explained.

A message or artwork heading to be printed in color is formed in a substantially conventional manner in which a section of paper or artboard 30 is provided with a guide line 32. The film 16 is manually lifted off its backing sheet 18 and flatly disposed on the top surface of the artboard 30 with a selected one of the characters disposed in position to form the first letter of a message with the transfer line 22 overlying the guide line 32 in longitudinally aligned relation. The selected character and its color components are then transferred as a unit to the surface of the artboard. Subsequently selected characters and their color components are similarly arranged and transferred to the board 30 in juxtaposed relation with respect to the previously transferred characters to from a message. Similarly, at least one vertical row of the register marks 20 are transferred to the respective end of the message formed. A photographic reproduction plate or engraving, formed from the message, is longitudinally separated along the lines 34, 36 and 38 for subsequent printing of the message in more than one color in a conventional manner wherein any inadvertent inaccurate alignment of the transfer lines 22 with respect to the guide lines 32 is compensated for in the finished layout and subsequent printing by the predetermined spacing between the font characters and their color separated components.

Obviously the invention is susceptible to changes or alterations without defeating its practicability. Therefore I do not wish to be confined to the preferred embodiment shown in the drawings and described herein.

I claim:

1. A method of preparing color separated fonts in printing registration, comprising the steps of:
    a. providing a positive print of a font;
    b. modifying the first character of the font to form at least one supplemental character component capable of being printed in color;
    c. forming an overlay for each supplemental component of the first character of the font for printing in color;
    d. continuing steps (b) and (c) for the remaining characters of the font;
    e. arranging the respective character of the font and its overlay containing the color separated components on a common plane in predetermined vertically spaced relation to form a unit in juxtaposition with respect to like units of the remaining characters of the font; and,
    f. printing the font units on a transparent film.

2. The method according to claim 1 in which step (a) includes:
    providing upper and lower case characters of the font.

3. The method according to claim 2 in which step (a) includes:
    providing a positive proof of a series of printing registration symbols.

4. The method according to claim 3 including the additional
    step of arranging the printing registration symbols in similar predetermined vertically spaced relation on the common plane to form at least two juxtaposed units of the registration symbols.

* * * * *